US012805216B2

(12) United States Patent
Naylor et al.

(10) Patent No.: US 12,805,216 B2
(45) Date of Patent: Nov. 17, 2026

(54) PASSIVATION OF CRYSTALLINE SUBSTRATE FOR METAL CHALCOGEN MATERIAL SYNTHESIS

(71) Applicant: Intel Corporation, Santa Clara, CA (US)

(72) Inventors: Carl H. Naylor, Portland, OR (US); Kirby Maxey, Hillsboro, OR (US); Kevin OBrien, Portland, OR (US); Chelsey Dorow, Portland, OR (US); Sudarat Lee, Hillsboro, OR (US); Ashish Verma Penumatcha, Beaverton, OR (US); Uygar Avci, Portland, OR (US); Matthew Metz, Portland, OR (US); Scott B. Clendenning, Portland, OR (US); Mahmut Sami Kavrik, Eugene, OR (US); Chia-Ching Lin, Portland, OR (US); Ande Kitamura, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 53 days.

(21) Appl. No.: 18/091,279

(22) Filed: Dec. 29, 2022

(65) Prior Publication Data

US 2024/0222113 A1 Jul. 4, 2024

(51) Int. Cl.
*H01L 29/04* (2006.01)
*H01L 29/10* (2006.01)
(Continued)

(52) U.S. Cl.
CPC ..... *H10P 14/3436* (2026.01); *H10D 62/8325* (2025.01); *H10P 14/271* (2026.01); *H10P 14/3458* (2026.01); *H10W 74/137* (2026.01)

(58) Field of Classification Search
CPC ............ H10P 14/3436; H10P 62/8325; H10P 14/271; H10P 14/3458; H10W 74/137; H10D 84/83; H10D 30/021; H10D 30/69; H10D 30/68; H10D 30/6735; H10D 30/6736; H10D 62/118; H10D 62/882;
(Continued)

(56) References Cited

U.S. PATENT DOCUMENTS

2020/0388685 A1* 12/2020 Sharma ................ H10D 30/024
2021/0083122 A1* 3/2021 Naylor .................. H10B 41/27
2021/0408375 A1* 12/2021 Dorow .................. H10B 61/22

* cited by examiner

*Primary Examiner* — Niki H Nguyen
(74) *Attorney, Agent, or Firm* — Essential Patents Group, LLP

(57) ABSTRACT

Integrated circuit (IC) structures comprising transistors with metal chalcogenide channel material synthesized on a workpiece comprising a Group IV crystal. Prior to synthesis of the metal chalcogenide material, a passivation material is formed over the Group IV crystal to limit exposure of the substrate to the growth precursor gas(es) and thereby reduce a quantity of chalcogen species subsequently degassed from the workpiece. The passivation material may be applied to the front side, back side, and/or edge of a workpiece. The passivation material may be sacrificial or retained as a permanent feature of an IC structure. The passivation material may be advantageously amorphous and/or a compound comprising at least one of a metal or nitrogen that is good diffusion barrier and thermally stable at the metal chalcogenide synthesis temperatures.

20 Claims, 7 Drawing Sheets

(51) Int. Cl.
*H01L 31/00* (2006.01)
*H10D 62/832* (2025.01)
*H10P 14/20* (2026.01)
*H10W 74/10* (2026.01)

(58) Field of Classification Search
CPC .... H10D 30/60; H10D 30/675; H10D 86/423; H10D 30/031; H10D 30/017; H10D 30/6741; H10D 30/024; H10D 64/685; H10D 62/862; H10D 62/151; H10D 62/8503; H10D 84/832; H10D 84/0167; H10D 84/0193; H10D 89/10; H10D 30/472; H10D 30/502; H10D 30/6891
See application file for complete search history.

PASSIVATION OF CRYSTALLINE SUBSTRATE FOR METAL CHALCOGEN MATERIAL SYNTHESIS

BACKGROUND

Demand for higher performance integrated circuits (ICs) has motivated development of non-silicon materials. One class of these materials is a compound of one or more metals and one or more chalcogens. Transition metal dichalcogenides (TMD or TMDC) are one exemplary species of the metal chalcogen class of materials. TMDCs display semiconductor properties as a unit cell of $MX_2$, where M is a transition metal atom (e.g., Mo, W) and X is a chalcogen atom (S, Se, or Te). Metal chalcogenide materials have been of significant interest in highly-scaled integrated circuitry. One advantage is the thin active layers possible. A metal chalcogenide-channeled transistor may therefore have excellent short channel properties. It has also been shown that many metal chalcogen materials have good electron and hole mobility, making them interesting for complementary short channel devices (e.g., $L_g<20$ nm).

However, most TMDC materials have thus far been obtained through bulk transfer techniques (e.g., employing exfoliation), that are nonideal for high volume device manufacturing. It would therefore be commercially advantageous to overcome the challenges associated with depositing/growing metal chalcogenide materials natively upon a monolithic IC substrate.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION OF EXEMPLARY EMBODIMENTS

Figure 1:
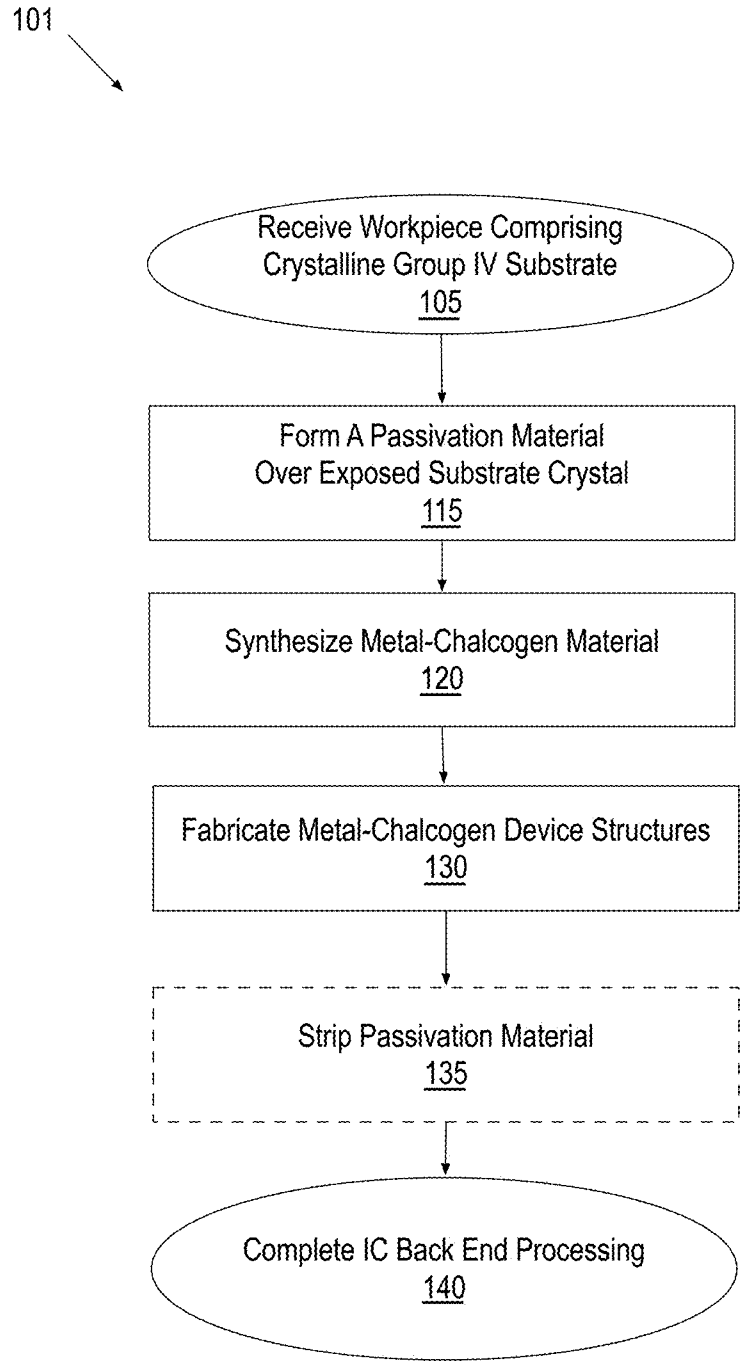
FIG. 1 is a flow diagram of methods for protecting a crystalline substrate material during metal chalcogen material synthesis, in accordance with some embodiments.

Embodiments are described with reference to the enclosed figures. While specific configurations and arrangements are depicted and discussed in detail, this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. These terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause-and-effect relationship).

The terms "over," "under," "between," and "on" as used herein refer to a relative position of one component or material with respect to other components or materials where such physical relationships are noteworthy. For example, in the context of materials, one material or layer over or under another may be directly in contact or may have one or more intervening materials or layers. Moreover, one material between two materials or layers may be directly in contact with the two materials/layers or may have one or more intervening materials/layers. In contrast, a first material or layer "on" a second material or layer is in direct contact with that second material/layer. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Unless otherwise specified in the specific context of use, the term "predominantly" means more than 50%, or more than half. For example, a composition that is predominantly a first constituent means more than half of the composition is the first constituent (e.g., <50 at. %). The term "primarily" means the most, or greatest, part. For example, a composition that is primarily a first constituent means the composition has more of the first constituent than any other constituent. A composition that is primarily first and second constituents means the composition has more of the first and second constituents than any other constituent. The term "substantially" means there is only incidental variation. For example, composition that is substantially a first constituent means the composition may further include <1% of any other constituent. A composition that is substantially first and second constituents means the composition may further include <1% of any constituent substituted for either the first or second constituent.

In accordance with embodiments herein, monolithic integrated circuitry includes a metal chalcogen-based transistor comprising a metal chalcogen channel material that is natively formed upon a monolithic workpiece further comprising a crystalline Group IV substrate. Rather than transferring the metal chalcogen material to such a workpiece, the workpiece is exposed to a metal chalcogen synthesis process. The inventors have found that when such a workpiece is exposed elevated synthesis temperatures, chalcogen species react with Group IV crystalline substrate material. Embodiments herein introduce a substrate passivation material prior to metal chalcogen synthesis. With the passivation material in place, the Group IV crystalline substrate material is protected from reactive species in the synthesis environment and fewer, if any, Group IV-chalcogen reaction products, and derivatives thereof, are generated.

FIG. 1 is a flow diagram of methods 200 for protecting a crystalline substrate material during metal chalcogen material synthesis, in accordance with some embodiments. Methods 200 may be practiced as wafer-level device fabrication process where a material comprising chalcogen, such as a metal chalcogenide, is synthesized upon a workpiece that comprises a substrate material susceptible to reacting with one or more chalcogen precursors enlisted in the synthesis.

Depending on chemical composition, a substrate material may be more or less susceptible to metal chalcogen material synthesis. The inventors have found the magnitude of deleterious effects associated with one or more side reactions between the substrate material and precursors of the metal chalcogen material synthesis dramatically increase with an increase in the surface area of crystalline substrate material exposed. Accordingly, such effects may not be evident until workpiece dimensions are sufficiently large. The inventors have further determined side reactions between substrate material and precursors of the metal chalcogen material synthesis are a strong function of synthesis temperature and so effects attributable to these reactions also become more significant as higher temperature synthesis processes are developed.

Methods 200 begin with receiving a workpiece at input 105. In exemplary embodiments, the workpiece received comprises a monocrystalline substrate material, such as, but not limited to, substantially monocrystalline silicon. Methods 200 continue at block 115 where a passivation material is deposited or otherwise formed over the workpiece to cover at least some exposed regions of the crystalline substrate material that would otherwise be susceptible to reacting with species present in a metal chalcogen material synthesis process. For embodiments where a back side surface the workpiece is substrate material, the passivation material is advantageously formed over at least the back side of the workpiece as this surface may otherwise present a large contiguous surface area of substrate material. The passivation material may also be formed on a side edge surface of the workpiece, which may comprise another large contiguous surface area of substrate material. The passivation material may also be formed over a front side surface of the workpiece as a function of an extent of substrate material area sufficiently proximal to the front side (working) surface that would otherwise be exposed.

Block 115 may be practiced early in a fabrication flow, for example as an initial starting wafer treatment. For some such embodiments, the passivation material layer(s) may be formed only on a back side and/or perimeter edge of the front side (working surface) of the workpiece, for example to facilitate fabrication of front-side structures that include some portion of the crystalline substrate material. Alternatively, passivation material may be formed also on the front side of the workpiece. For such embodiments, the passivation material may remain a continuous film over the entirety of the front side or may be subtractively patterned during fabrication of front-side structures that include some portion of the crystalline substrate material.

In other embodiments, block 115 is practiced later in a fabrication flow, for example after fabrication of front-side structures that include some portion of the crystalline substrate material. For such embodiments, the passivation material layer(s) may be similarly formed only on a back side and/or perimeter edge of the workpiece at block 115. Alternatively, in addition to forming the passivation material on the back side and/or perimeter edge of the workpiece, the passivation material may be formed over front-side structures that include some portion of the crystalline substrate material.

With the passivation material in place to protect the crystalline substrate material, methods 200 continue at block 120 where a metal chalcogen material is synthesized upon the workpiece. As used herein, metal chalcogen material synthesis is distinct from a mechanical transfer of a metal chalcogen material preform. In exemplary embodiments, block 120 comprises a molecular beam deposition process or a chemical vapor deposition (CVD) process.

In some exemplary embodiments, block 120 entails a thermal process performed in the presence of a precursor comprising S, Se or Te. In some examples, the substrate is heated to over 400° C. (e.g., 450-1000° C.) in the presence of a chalcogen precursor gas, such as $H_2S$, $H_2Se$, or $H_2Te$. Since these exemplary precursors can also act as strong reducing agents, they may be combined or replaced with weaker reducing agents/stronger oxidizing agents. For example, in some embodiments $SO_2$ or $SeO_2$ is introduced in combination with, or to the exclusion of, $H_2S$ or $H_2Se$, respectively. Other gases, such as, $NH_3$, $SF_6$, $N_2$, Ar, $N_2O$ may also be introduced in combination with one or more of $H_2S$ and $SO_2$, $H_2Se$ and $SeO_2$, or $H_2Te$ with gases lacking oxygen tempering the reducing strength somewhat less than those which introduce oxygen.

A synthesis process may further include a vapor or liquid source of one or more metals, in addition to the chalcogen precursor. For example, a metal precursor introduced at block 120 may be the only source of metal incorporated in the compound synthesized. The metal precursor is advantageously a metalorganic, and the CVD process practiced at block 120 is more specifically an MOCVD growth process. Although vapor/gas metalorganic sources are advantageous, liquid metalorganic precursors may also be used, for example with an MOCVD growth process that utilizes a bubbler.

As noted above, passivation material 215 protects substrate material 200 from chalcogenation that can otherwise occur during metal chalcogen material synthesis. More specifically, the inventors have found Group IV crystalline substrate material (e.g., silicon) is susceptible to chalcogenation, particularly where synthesis temperatures exceed 500° C. (e.g., 750-1000° C.). Aside from competing with metal chalcogen material synthesis, the inventors have found substrate chalcogenation to induce mass degassing of the workpiece after metal chalcogen material synthesis. The outgassed species were further found to include a high concentration of chalcogen hydrides. For example, where a precursor comprising S is allowed to react with the substrate material during metal chalcogen material synthesis, a significant amount of $H_2S$ may be subsequently outgassed from the workpiece. In other examples where a precursor comprising Te is allowed to react with the substrate material during metal chalcogen material synthesis, a significant amount of $H_2Te$ may be subsequently outgassed from the workpiece.

Although not bound by theory, the inventors currently understand crystalline substrate material (e.g., silicon) to react with the chalcogen (e.g., S) with the chalcogenation product (e.g., silicon sulfide) then remaining on the substrate surface. The reaction product is highly hygroscopic, and can outgas from the substrate material surface as chalcogen hydride (e.g., $H_2S$) upon exposure to air. With the quantity of harmful gas emission scaling with the substrate diameter, passivation materials in accordance with embodiments are best implemented to most greatly reduce the area of substrate material exposed to the metal chalcogen synthesis process.

Methods 200 then continue at block 130 where device structures comprising the metal chalcogen material are fabricated. In some embodiments, three or four terminal transistor structures are fabricated at block 130. Such structures may have any architecture known to be suitable for a functional transistor. In some examples, the transistors are field effect transistors (FETs). Optionally, at block 135 some regions of the passivation material may be removed after synthesis of the metal-chalcogen material. Sacrificial passivation material may be removed before or after fabrication of the device structures at block 130. Block 130 is drawn in dashed line to emphasize that passivation material may be optionally retained substantially everywhere on the workpiece. If the passivation material is to be removed, any wet chemical or dry plasma based etch process suitable for the composition of the passivation material may be practiced at block 135.

Methods 200 complete at output 140 where back end of line (BEOL) processing is performed according to any known techniques, for example to electrically interconnect the transistor structures formed at block 130 into monolithic integrated circuitry.

Figure 2:
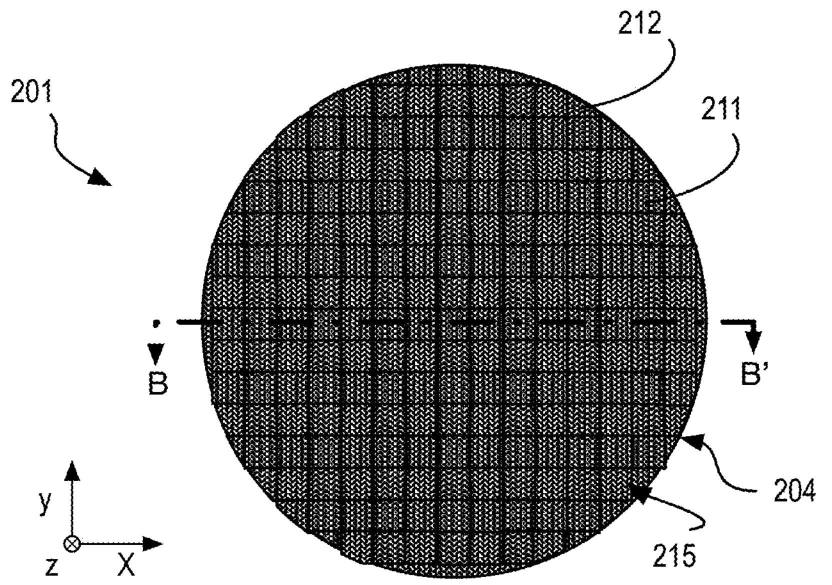
FIG. 2 is a plan view of a monolithic workpiece, in accordance with some embodiments.

FIG. 2 is a plan view of an exemplary monolithic workpiece 201, in accordance with some embodiments. In this example, workpiece 201 is a large diameter crystalline wafer (e.g., 300-450 mm in diameter). IC die regions 211 are arrayed over a front (working) side of workpiece 201. IC die regions 211 are regions from where fully functional IC die will be singulated after wafer-level processing of workpiece 201 is completed. IC die regions 211 may comprise patterned features, or not. IC die regions 212 are regions along a perimeter of workpiece 201, proximal to edge 204. In contrast to IC die regions 211, IC die regions 212 are individually each too small in area (i.e., footprint within x-y plane) to support fully functional IC die. In FIG. 2, an entirety of the front side of workpiece 201 is substantially covered with a substrate passivation material 215.

Figure 3A:
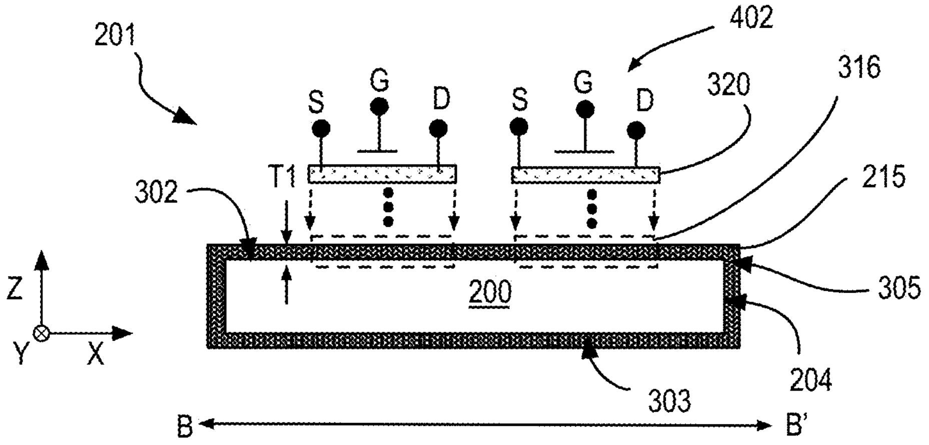
FIG. 3A is a cross-sectional view of a passivation material layer over surfaces of the workpiece illustrated in FIG. 2, in accordance with some embodiments.

FIG. 3A is a cross-sectional view of a passivation material layer 215 over certain surfaces of workpiece 201, in accordance with some embodiments. As shown, workpiece 201 comprises a substrate material 200. In exemplary embodiments, substrate material 200 is crystalline and comprises one or more Group IV elements, which are susceptible to side reactions with precursors of metal chalcogen material synthesis. For example, substrate material 200 may be a single crystal of any of Si, Ge, SiGe, or GeSn. In other embodiments, the substrate material may comprise one or more (mono)crystalline Group III-V materials (e.g., GaAs), one or more (mono)crystalline Group III-N materials (e.g., GaN).

In FIG. 3A, passivation material 215 has been formed adjacent to a sidewall of workpiece edge 204. In further embodiments where edge 204 comprises a corner bevel 305, passivation material 215 is adjacent to, or over, corner bevel 305. Passivation material 215 also covers an entirety of back side surface 303. FIG. 3A illustrates one example where passivation material 215 is also over an area 316 of workpiece front side 302 occupied or otherwise underlying transistor structure 402. Area 316 demarked by a dashed box is an area (e.g., within x-y plane) underlying transistor structure 402, for example further demarked by vertical dashed arrows representing a z-axis projection of transistor structure 402 to the underlying surface of substrate material 200. As further illustrated in FIG. 3A, passivation material 215 may also be beyond, or outside of, transistor structure area 315. For example, passivation material 215 may be within a space between two areas 316 associated with adjacent transistor structures 402. For such embodiments, within workpiece front side 302 passivation material 215 may only be present in areas beyond transistor structure 402 (i.e., absent from areas 316), or passivation material 215 may cover an entirety of workpiece front side 302 (e.g., substantially as illustrated).

For the embodiments represented by FIG. 3A, passivation material 215 may have substantially the same material properties (e.g., homogenous composition and microstructure) over all illustrated surfaces and is advantageously a contiguous and/or continuous layer (i.e., no through pinholes) of at least some non-zero minimum thickness T1 regardless of location within workpiece 201.

Figure 3B:
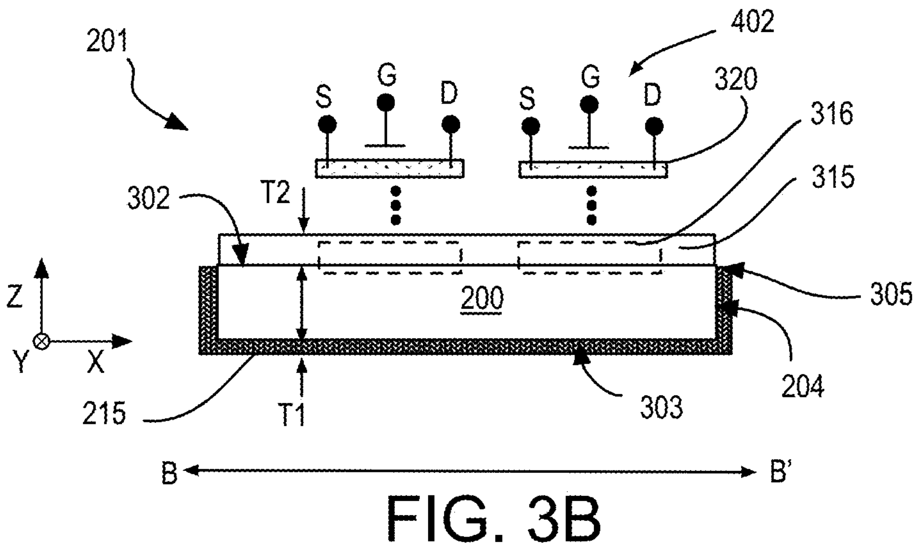
FIG. 3B is a cross-sectional view of passivation material applied over surfaces of the workpiece illustrated in FIG. 2, in accordance with some alternative embodiments.

FIG. 3B is a cross-sectional view of passivation material 215 applied over only sidewall edge surface 204, corner bevel 305 and back side surface 303, in accordance with some alternative embodiments. FIG. 3B further illustrates embodiments where front side surface 302 is protected by an alternative front-side material 315, which has a different chemical composition than passivation material 215. Front-side material 315 has another non-zero minimum thickness T2, which may differ from T1 as a function of the relative efficacy of the chalcogen diffusion barrier posed by each of materials 215 and 315.

In some embodiments, passivation material (e.g., 215) is in direct contact with substrate material 200, as depicted in FIG. 3A. Alternatively, one or more thin film layers may be present between substrate material 200 and passivation material 215.

Passivation material 215 may have any microstructure, film thickness and chemical composition deemed an adequate barrier to reactive chalcogen species introduced during the synthesis of metal chalcogen material over some portion of the substrate. Passivation material is advantageously an amorphous material, as grain boundaries present in material having (poly)crystalline microstructure may permit greater diffusion of reactive chalcogen species.

In some exemplary embodiments, substrate passivation material is a compound of at least one of nitrogen or a metal. Metal oxide and metal nitride compounds may each be suitable as substrate passivation material, particularly those compounds that have amorphous microstructure. Exemplary metals include Al, Hf, Zr, Ta or W, which can form compounds that offer good diffusion barrier properties and are compositionally stable at high temperatures (e.g., 750-1000° C.). $AlO_x$, and $AlN_x$ compounds have the advantage of being less grainy than some other metallic compounds (e.g., $HfO_x$) although the latter may also be suitable. Substrate passivation material may also be a metal oxynitride (e.g., $AlO_xN_y$) metal carbide (e.g., $AlC_x$), or metal carbonitride (e.g., AlCN).

The inventors have found silicon nitride to also be a good substrate passivation material, even at thicknesses of less than 100 nm. Noting passivation material may be advantageously applied to back side surface of a workpiece, compounds like $Si_3N_4$ that can be formed on the back side surface at relatively low cost (e.g., with a CVD furnace) are advantageous. Other compounds of silicon, such as metal silicides (e.g., $WSi_x$), silicon carbides or metal silicon carbides, etc. may also be suitable as the substrate passivation material, and may offer some other advantages such as substrate-selective formation, etc.

FIGS. 3A and 3B illustrate examples where a metal chalcogenide material 320 has been synthesized over passivated substrate 200 with arbitrary intervening material layers and/or structures represented by ellipses. In some embodiments, metal chalcogenide material 320 is a material suitable as a channel material for either a p-type or n-type transistor structure 402. In these examples, three transistor terminals including a gate terminal (G), source terminal (S) and drain terminal (D) are coupled through a channel region of the transistor structure 420, the channel region comprising metal chalcogenide material 320.

In some embodiments metal chalcogenide material 320 is a dichalcogenide ($MC_2$). However, because other oxidation states are possible the metal chalcogen material grown at block 120 may be better characterized as $MC_x$ with x being between 0.2 and 4. For embodiments herein, chalcogens include at least one of sulfur, selenium or tellurium (oxygen is excluded), with S or Se being particularly advantageous. The metal chalcogenide material 320 may therefore be $MS_x$, $MSe_x$, or $MTe_x$, for example.

In some exemplary embodiments, metal M is Cu, Zn, Zr, Re, Hf, Ir, Ru, Cd, Ni, Co, Pd, Pt, Ti, Cr, V, W Mo, Al, Sn, Ga, In, B, Ge, Si, P, As, or Sb. Metal chalcogenide material 320 formed may be predominantly one of these metals and one or more of the chalcogens. For example, the metal chalcogenide may be any of $CuS_x$, $CuSe_x$, $CuTe_x$, $ZnS_x$, $ZnSe_x$, $ZnTe_x$ $ZrS_x$, $ZrSe_x$, $ZrTe_x$, $ReS_x$, $ReSe_x$, $TeSe_x$ $RuS_x$, $RuSe_x$, $RuTe_x$ $IrS_x$, $IrSe_x$, $IrTe_x$, $CdS_x$, $CdSe_x$, $CdTe_x$ $NiS_x$, $NiSe_x$, $NiTe_x$ $CoS_x$, $CoSe_x$, $CoTe_x$ $PdS_x$, $PdSe_x$, $PtSe_x$ $PtS_x$, $PtSe_x$, $PtTe_x$ $TiS_x$, $TiSe_x$, $TiTe_x$ $CrS_x$, $CrSe_x$, $CrTe_x$ $VS_x$, $VSe_x$, $VTe_x$, $WS_x$, $WSe_x$, $WTe_x$ $MoS_x$, $MoSe_x$, $MoTe_x$, $AlS_x$, $AlSe_x$, $AlTe_x$ $SnS_x$, $SnSe_x$, $SnTe_x$, $GaS_x$, $GaSe_x$, $GaTe_x$ $InS_x$, $InSe_x$, $InTe_x$ $SbS_x$, $SbSe_x$, $SbTe_x$ $GeS_x$, $GeSe_x$, $GeTe_x$ $SiS_x$, $SiSe_x$, or $SiTe_x$. Of these compounds, $MoS_x$, $MoSe_x$, $MoTe_x$ and $WS_x$, $WSe_x$, $WTe_x$ may be particularly advantageous for implementing a transistor. In further embodiments, the metal includes multiple metals as M1M2 or M1M2M3 alloys along with one or more of S, Se, or Te. For example, metal chalcogenide material 320 may be $InGaZnSe_x$.

Figure 4:
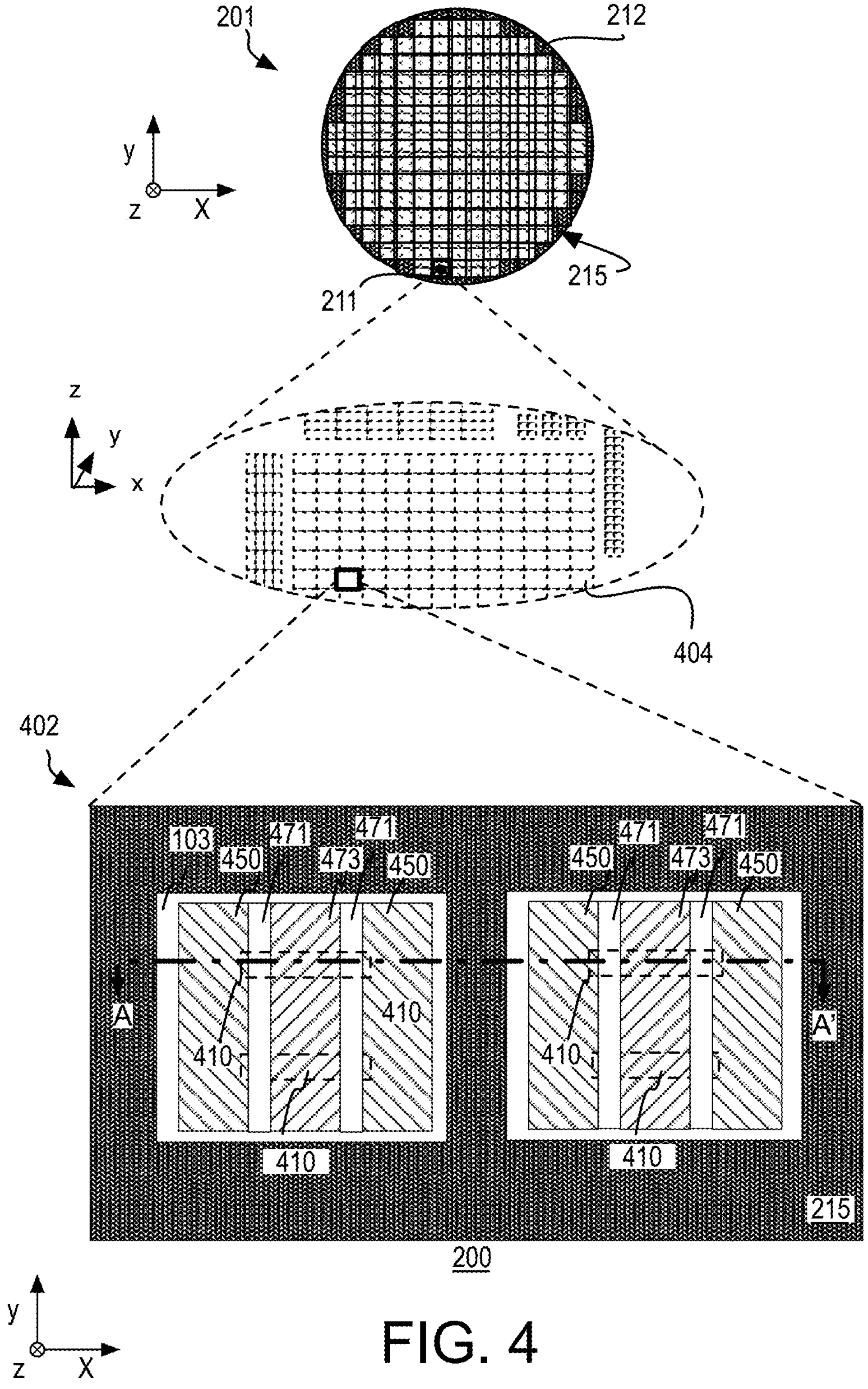
FIG. 4 is a plan view of a front side of a workpiece with passivation material layer between a plurality of device structures and an underlying crystalline substrate material, in accordance with some embodiments.

As noted above, substrate passivation material may be substantially covering a front side of a workpiece such that the passivation material is between the substrate material and metal chalcogen material subsequently synthesized upon the workpiece. Passivation material may also be patterned, for example to facilitate the fabrication of various structures into the substrate material. FIG. 4 is a plan view of a front side of IC die workpiece 201, an expanded plan view of IC die 211, and a further expanded plan view of a circuit cell 404 within IC die 211, in accordance with some embodiments. As shown, passivation material 215 within perimeter IC die regions 212 may be substantially contiguous. Passivation material 215 within IC die regions 211 may be similarly contiguous, or may instead be patterned, for example according to an isolation mask, to substantially surround individual device structures.

Circuit cell 404 may include a plurality of field effect transistor (FET) structures 402. Each FET structure includes a source terminal, a drain terminal, and a gate terminal. FET structures 402 are stacked 2D multi-channel transistor structures, each including at least one stack of channel regions 410 and each channel region comprising metal chalcogen material, such as any of those describe above for metal chalcogenide material 320.

Opposite ends of channel regions 410 are electrically coupled to source/drain metallization 450. A gate electrode 473 and extends across channel regions 410. An electrically insulating spacer dielectric 471 laterally separates gate electrode 473 from source/drain metallization 450. Source/drain metallization 450 may include one or more metals (e.g., Ti, Sb, Ru, their alloys, and nitrides) that form an ohmic or tunneling junction with channel regions 410. Spacer dielectric 471 may be or any insulator such as, but not limited to, silicon dioxide, silicon nitride, or silicon oxynitride, or any known low-k dielectric material having a relative permittivity below 4.0.

Figure 5:
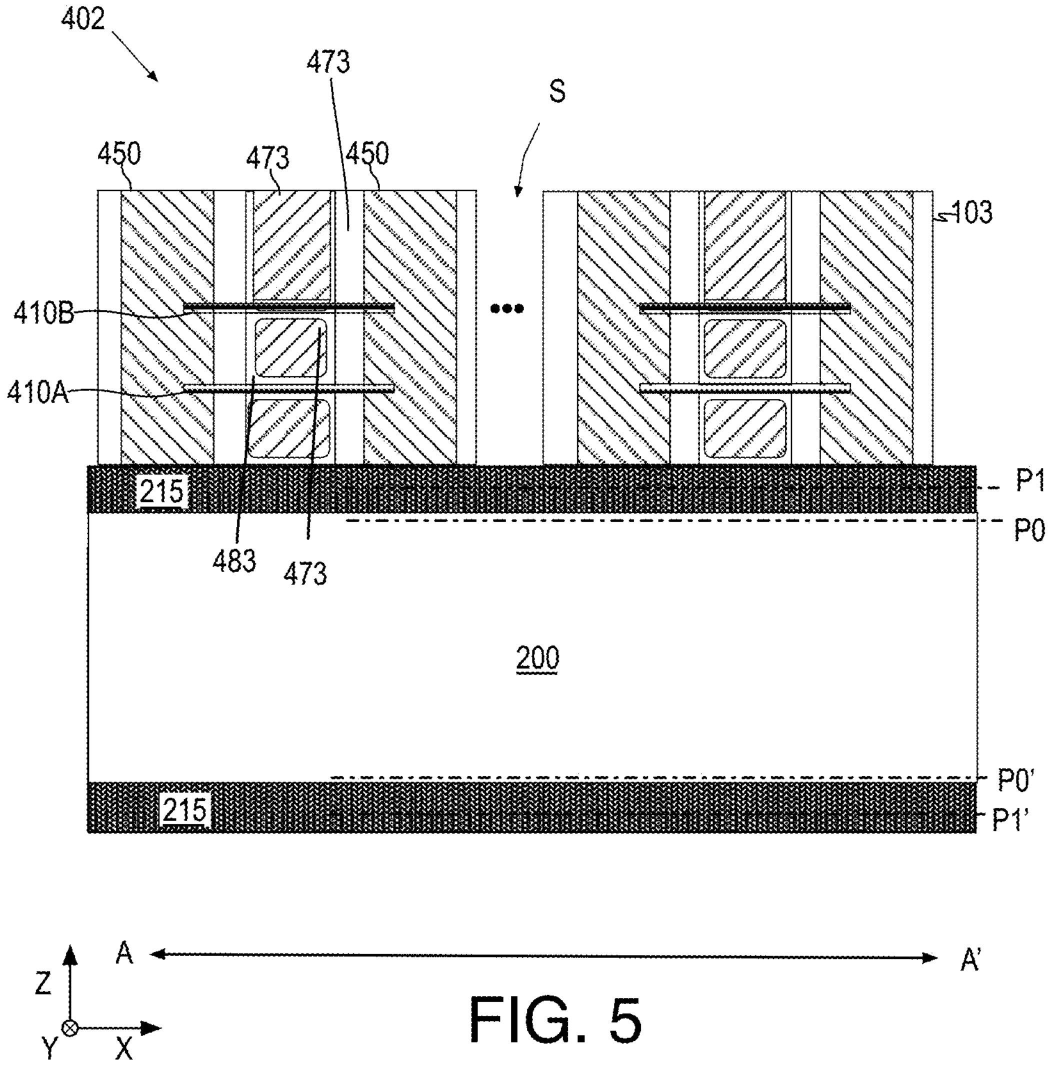
FIG. 5 is a cross-sectional view of the passivation material layer, device structure and substrate material illustrated in FIG. 4, in accordance with some embodiments.

As further illustrated in FIG. 5, passivation material 215 is a contiguous film extending under the plurality of transistors structures 402 and spanning the space S between adjacent structures 402. In this example, passivation material 215 is a layer of material that is on a plane P1, which is substantially planar to a plane P0 of the front side surface of crystalline substrate material 200. Passivation material 215 is also on a plane P1', which is substantially planar to a plane P0' of the back side surface of crystalline substrate material 200. In the illustrated example, passivation material 215 is in direct contact with both the front side and back side surfaces of substrate material 200.

In the example further illustrated in FIG. 5, transistor structures 402 include a first channel region 410A in a stack with a second channel region 410B, each comprising a metal chalcogenide compound. As further illustrated, gate electrode 473 is between channel regions 410A and 410B and a gate insulator 483 is between each channel region 410A, 410B and gate electrode 473. An isolation dielectric 103 is between adjacent ones of the plurality of transistors structures 402. Gate electrode 473 may advantageously comprise a workfunction metal, such as, but not limited to, TiN. Gate insulator 483 is advantageously a high-k dielectric material having a relative permittivity exceeding 9. In some embodiments, gate insulator 483 is a metal oxide, such as hafnium oxide ($HfO_x$) or aluminum oxide ($AlO_x$), which may be deposited with an ALD process, for example.

A single crystal substrate and substrate passivation material may be integrated with any metal chalcogen material synthesis and therefore integrated into a wide variety of ICs and computing systems that include such ICs. In some embodiments where at least a portion of the substrate is removed during subsequent processing, some or all of the passivation material protecting the substrate during metal chalcogen synthesis may be absent from a fully fabricated IC die. For example, passivation material on a backside of a workpiece may be removed during wafer thinning and/or backside grind along with a significant portion of the crystalline substrate. In other examples where passivation material is formed on an edge of a workpiece, the edge region of the workpiece may be discarded when IC die are singulated from the workpiece.

Figure 6:
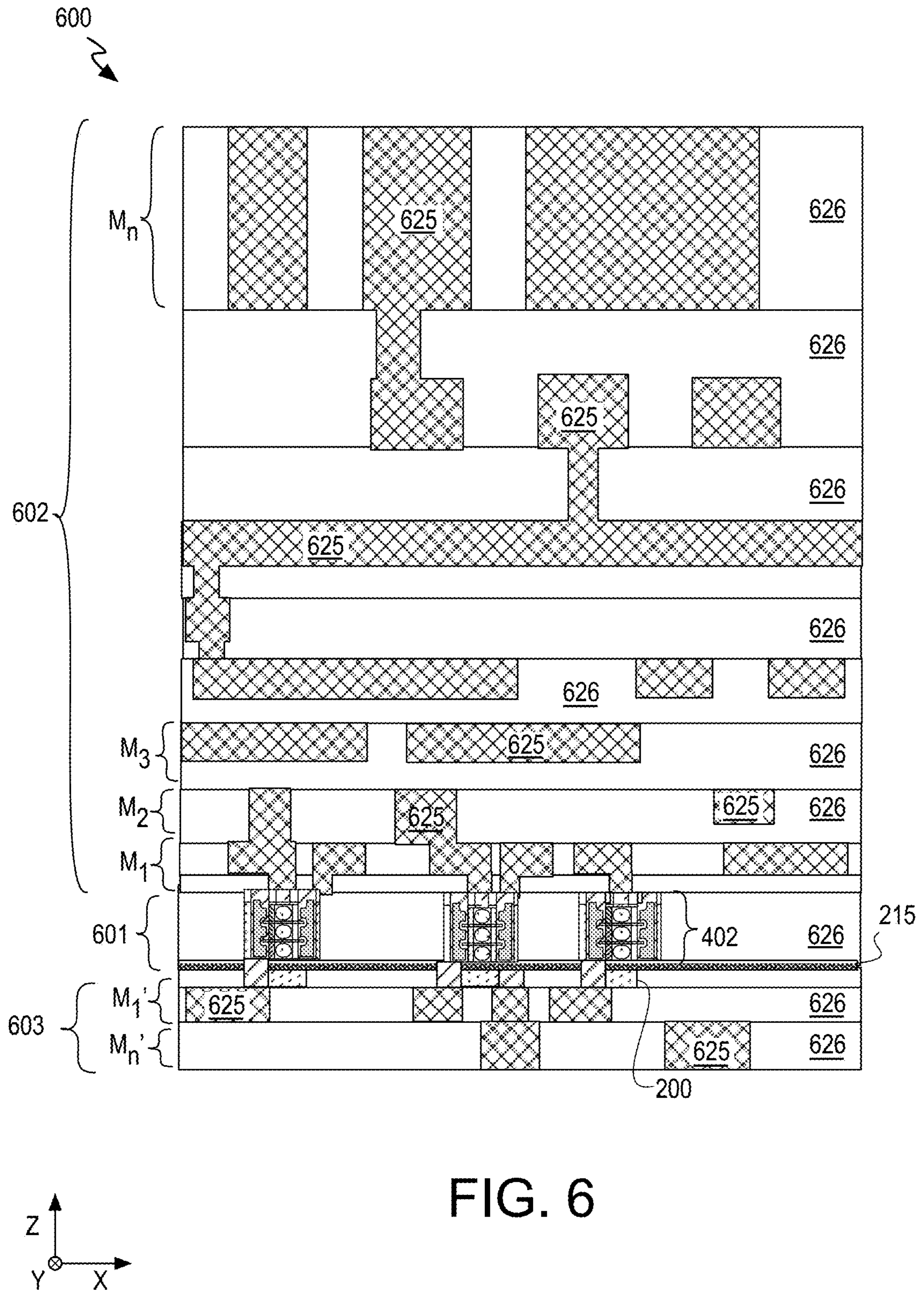
FIG. 6 is a cross-sectional view of a monolithic IC structure comprising a metal chalcogenide-based transistor structure and substrate passivation, in accordance with some embodiments.

FIG. 6 is a cross-sectional view of an IC structure 600, in accordance with some embodiments further illustrating retention of at least some substrate passivation material 215. IC structure 600 illustrates a portion of a monolithic IC die that includes FEOL interconnect metallization levels 602 over and/or on a front side of a device layer 601 that includes stacked ribbon or wire (RoW) transistor structures 402 including metal chalcogen channel material, for example.

Within IC structure 600, front-side interconnect metallization levels 602 include interconnect metallization 625 electrically insulated by dielectric material 626. In the exemplary embodiment illustrated, front-side interconnect metallization levels 602 include metal-one ($M_1$), metal-two ($M_2$), metal-three ($M_3$) and metal-n ($M_n$) interconnect metallization levels. Interconnect metallization 625 may be any metal(s) suitable for IC interconnection. Interconnect metallization 625, may be, for example, an alloy of predominantly Cu, an alloy of predominantly W, an alloy of predominantly Ru, an alloy of predominantly Al, an alloy of predominantly Mo, etc. Dielectric material 626 may be any dielectric material known to be suitable for electrical isolation of monolithic ICs. In some embodiments, dielectric material 626 comprises silicon, and at least one of oxygen and nitrogen. Dielectric material 626 may be SiO, SiN, or SiON, for example. Dielectric material 626 may also be a low-K dielectric material (e.g., having a dielectric constant below that of $SiO_2$). Although metal-one is illustrated to have lines and vias of different heights, for example in accordance with some embodiments described above, any of the other metallization levels may have lines and vias of different heights.

IC structure 600 further includes back-side interconnect metallization levels 603. Within interconnect metallization levels 603, interconnect metallization 625 is again electrically insulated by dielectric material 626. Back-side metallization levels 603 may comprise any number of metallization levels over, or on, a back side of transistor structures 402. In the illustrated example back-side metallization, metallization levels 603 include a metallization level $M_1'$ through nearest to transistor structures 402 (e.g., opposite $M_1$) through an uppermost back-side metallization level $M_n'$.

As shown, only a few regions of substrate material 200 remain between device layer 601 and back side metallization levels 603. With a thinning and/or patterning of substrate material 200, any passivation material 215 that may have been protecting a back side surface of substrate material 200 is absent from IC structure 600. However, FIG. 6 illustrates one example where passivation material 215 remains between substrate material 200 and a plurality of overlying transistors structures 402. Passivation material 215 may therefore be identified in IC structure 600, for example with a various chemical composition analysis techniques. Although IC structure 600 includes one device level 601 comprising transistor structures 402, there may be multiple device levels 601 located within the various interconnect metallization levels. Regardless of the number of device levels, an IC structure that includes only one instance of passivation material 215 is indicative of that material's association with substrate material 200 and its function in passivating and/or protecting substrate material 200.

Figure 7:
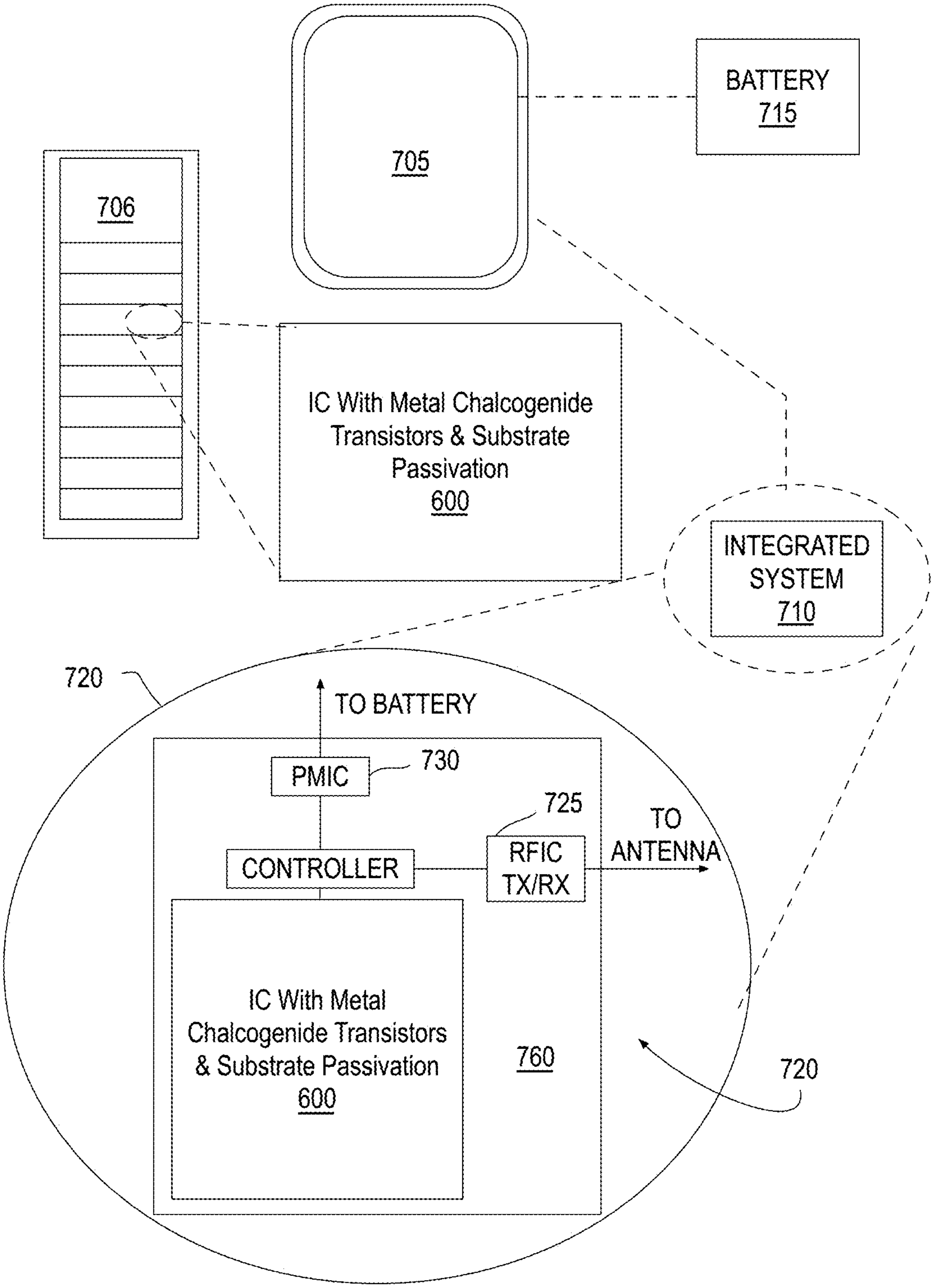
FIG. 7 illustrates a mobile computing platform and a data server machine employing an IC device including a metal chalcogenide-based transistor and substrate passivation, in accordance with some embodiments.

FIG. 7 illustrates a mobile computing platform 705 and a data server machine 706 employing a packaged IC die including metal chalcogenide transistors and substrate passivation, for example as described elsewhere herein. Server machine 706 may be any commercial server, for example including any number of high-performance computing platforms disposed within a rack and networked together for electronic data processing, which in the exemplary embodiment includes a packaged IC die comprising IC structure 600, for example as described elsewhere herein.

The mobile computing platform 705 may be any portable device configured for each of electronic data display, electronic data processing, wireless electronic data transmission, or the like. For example, the mobile computing platform 705 may be any of a tablet, a smart phone, laptop computer, etc., and may include a display screen (e.g., a capacitive, inductive, resistive, or optical touchscreen), an integrated system 710, and a battery 715.

As illustrated in the expanded view 720, IC structure 600 is further coupled to host component 760. One or more of a power management integrated circuit (PMIC) 730 or RF (wireless) integrated circuit (RFIC) 725 including a wideband RF (wireless) transmitter and/or receiver may be further coupled to host component 760. PMIC 730 may perform battery power regulation, DC-to-DC conversion, etc., and so has an input coupled to battery 715 and with an output providing a current supply to other functional modules. As further illustrated, in the exemplary embodiment, RFIC 725 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G and beyond.

Figure 8:
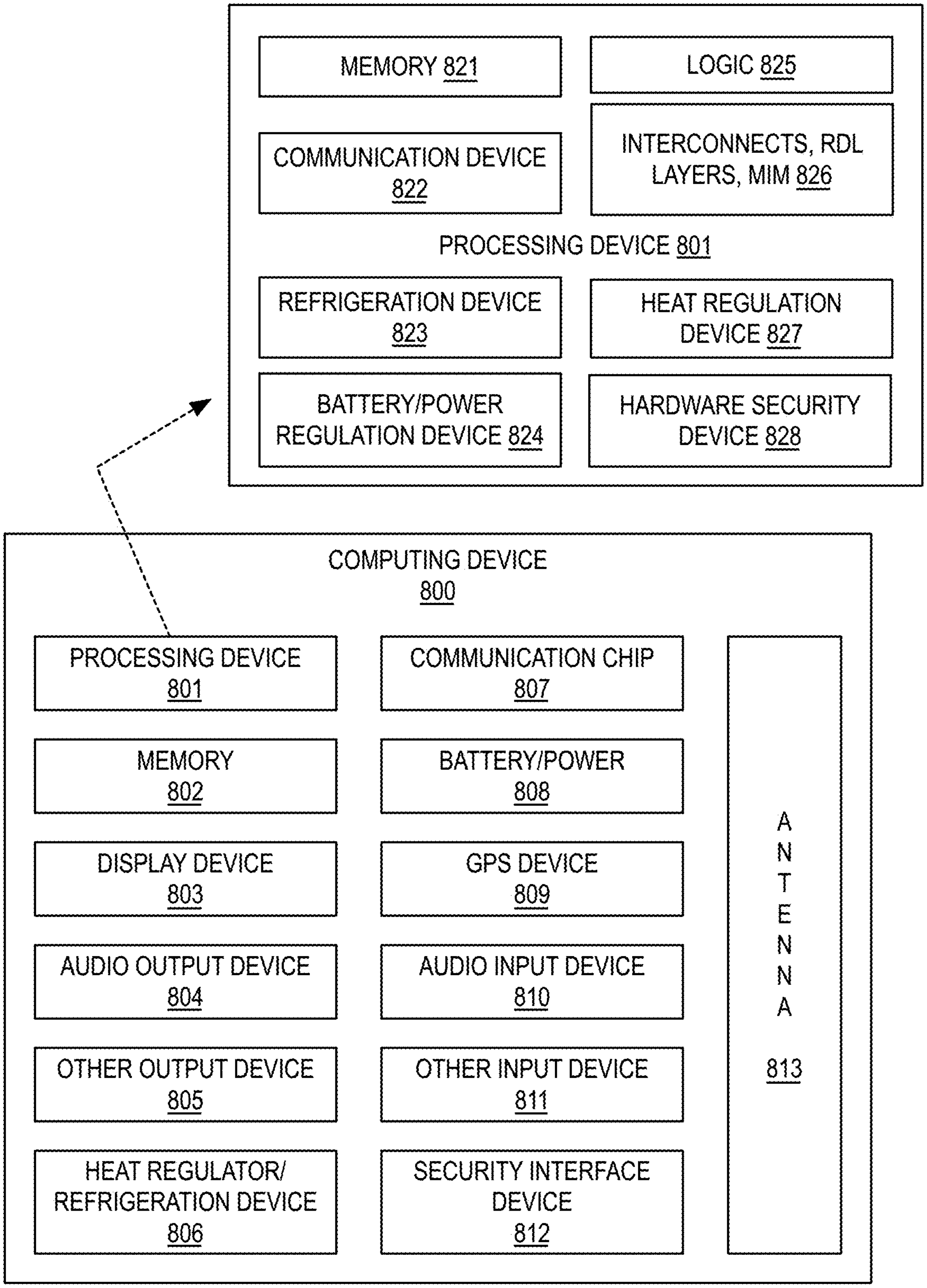
FIG. 8 is a functional block diagram of an electronic computing device, in accordance with some embodiments.

FIG. 8 is a block diagram of a cryogenically cooled computing device 800 in accordance with some embodiments. For example, one or more components of computing device 800 may include any of the devices or interconnect structures discussed elsewhere herein. A number of components are illustrated in FIG. 8 as included in computing device 800, but any one or more of these components may be omitted or duplicated, as suitable for the application. In some embodiments, some or all of the components included in computing device 800 may be attached to one or more printed circuit boards (e.g., a motherboard). In some embodiments, various ones of these components may be fabricated onto a single system-on-a-chip (SoC) die. Additionally, in various embodiments, computing device 800 may not include one or more of the components illustrated in FIG. 8, but computing device 800 may include interface circuitry for coupling to the one or more components. For example, computing device 800 may not include a display device 803, but may include display device interface circuitry (e.g., a connector and driver circuitry) to which display device 803 may be coupled.

Computing device 800 may include a processing device 801 (e.g., one or more processing devices). As used herein, the term processing device or processor indicates a device that processes electronic data from registers and/or memory to transform that electronic data into other electronic data that may be stored in registers and/or memory. Processing device 801 may include a memory 821, a communication device 822, a refrigeration/active cooling device 823, a battery/power regulation device 824, logic 825, interconnects 826 (i.e., optionally including redistribution layers (RDL) or metal-insulator-metal (MIM) devices), a heat regulation device 827, and a hardware security device 828.

Processing device 801 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

Processing device 801 may include a memory 802, which may itself include one or more memory devices such as volatile memory (e.g., dynamic random-access memory (DRAM)), nonvolatile memory (e.g., read-only memory (ROM)), flash memory, solid state memory, and/or a hard drive. In some embodiments, memory 821 includes memory that shares a die with processing device 802. This memory may be used as cache memory and may include embedded dynamic random-access memory (eDRAM) or spin transfer torque magnetic random-access memory (STT-M RAM).

Computing device 800 may include a heat regulation/refrigeration device 806. Heat regulation/refrigeration device 806 may maintain processing device 802 (and/or other components of computing device 800) at a predetermined low temperature during operation. This predetermined low temperature may be any temperature discussed elsewhere herein.

In some embodiments, computing device 800 may include a communication chip 807 (e.g., one or more communication chips). For example, the communication chip 807 may be configured for managing wireless communications for the transfer of data to and from computing device 800. The term "wireless" and its derivatives may be used to describe circuits, devices, systems, methods, techniques, communications channels, etc., that may communicate data through the use of modulated electromagnetic radiation through a nonsolid medium.

Communication chip 807 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. Communication chip 807 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. Communication chip 807 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 807 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 807 may operate in accordance with other wireless protocols in other embodiments. Computing device 800 may include an antenna 813 to facilitate wireless communications and/or to receive other wireless communications (such as AM or FM radio transmissions).

In some embodiments, communication chip 807 may manage wired communications, such as electrical, optical, or any other suitable communication protocols (e.g., the Ethernet). As noted above, communication chip 807 may include multiple communication chips. For instance, a first communication chip 807 may be dedicated to shorter-range wireless communications such as Wi-Fi or Bluetooth, and a second communication chip 807 may be dedicated to longer-range wireless communications such as GPS, EDGE, GPRS, CDMA, WiMAX, LTE, EV-DO, or others. In some embodiments, a first communication chip 807 may be dedicated to wireless communications, and a second communication chip 807 may be dedicated to wired communications.

Computing device 800 may include battery/power circuitry 808. Battery/power circuitry 808 may include one or more energy storage devices (e.g., batteries or capacitors) and/or circuitry for coupling components of computing device 800 to an energy source separate from computing device 800 (e.g., AC line power).

Computing device 800 may include a display device 803 (or corresponding interface circuitry, as discussed above). Display device 803 may include any visual indicators, such as a heads-up display, a computer monitor, a projector, a touchscreen display, a liquid crystal display (LCD), a light-emitting diode display, or a flat panel display, for example.

Computing device 800 may include an audio output device 804 (or corresponding interface circuitry, as discussed above). Audio output device 804 may include any device that generates an audible indicator, such as speakers, headsets, or earbuds, for example.

Computing device 800 may include an audio input device 810 (or corresponding interface circuitry, as discussed above). Audio input device 810 may include any device that generates a signal representative of a sound, such as microphones, microphone arrays, or digital instruments (e.g., instruments having a musical instrument digital interface (MIDI) output).

Computing device 800 may include a global positioning system (GPS) device 809 (or corresponding interface circuitry, as discussed above). GPS device 809 may be in communication with a satellite-based system and may receive a location of computing device 800, as known in the art.

Computing device 800 may include another output device 805 (or corresponding interface circuitry, as discussed above). Examples include an audio codec, a video codec, a printer, a wired or wireless transmitter for providing information to other devices, or an additional storage device.

Computing device 800 may include another input device 811 (or corresponding interface circuitry, as discussed above). Examples may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 800 may include a security interface device 812. Security interface device 812 may include any device that provides security measures for computing device 800 such as intrusion detection, biometric validation, security encode or decode, managing access lists, malware detection, or spyware detection. In some examples, security interface device 812 comprises OTP ROM further including a via MIM fuse, for example as described elsewhere herein.

Computing device 800, or a subset of its components, may have any appropriate form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the disclosure is not limited to the embodiments so described, but instead can be practiced with modification and alteration without departing from the scope of the appended claims. For example, the above embodiments may include specific combinations of features as further provided below.

In first examples, an integrated circuit (IC) structure comprises a monocrystalline material comprising a group IV element, a transistor structure comprising a gate terminal coupled to a channel material, the channel material comprising a metal and a chalcogen, and a passivation material between the monocrystalline material and the transistor structure. The passivation material comprises least one of nitrogen or a metal.

In second examples, for any of the first examples the passivation material extends beyond an area of the transistor structure.

In third examples, for any of the second examples the transistor structure is one of a plurality of transistors structures occupying a region over the monocrystalline material, and the passivation material is a continuous layer that spans at least the entire region and is at least 50 nm thick.

In fourth examples, for any of the third examples the monocrystalline material is primarily silicon, the monocrystalline material and the passivation material are both substantially planar layers within the area of the plurality of transistors, and a plane of the passivation material is parallel to a plane of the crystalline material.

In fifth examples for any of the first through fourth examples the passivation material is in direct contact with the monocrystalline material.

In sixth examples, for any of the first through fifth examples the passivation material is amorphous and comprises at least one of Al, Hf or Zr and at least one of oxygen or nitrogen.

In seventh examples, for any of the first through fifth examples the passivation material comprises predominantly silicon and nitrogen.

In eighth examples, an integrated circuit (IC) wafer comprises a monocrystalline substrate material comprising a group IV element. The wafer comprises plurality of IC dies arrayed over a front side area of the monocrystalline substrate material. Individual ones of the IC dies comprise a transistor structure comprising a gate terminal coupled to a channel material, the channel material comprising a metal and a chalcogen. The wafer comprises passivation material over a back side area of the monocrystalline substrate material. The passivation material comprises least one of nitrogen or a metal.

In ninth examples, for any of the eighth examples the passivation material is adjacent to a sidewall edge of the monocrystalline substrate material.

In tenth examples, for any of the ninth examples the passivation material is over a portion of the front side of the monocrystalline substrate material within a perimeter bevel area of the wafer adjacent to one or more edges of the IC dies.

In eleventh examples, for any of the eighth through tenth examples the passivation material is between the transistor structure and the front side of the monocrystalline material.

In twelfth examples, a method of fabricating an IC structure comprises receiving a workpiece comprising a crystalline Group IV substrate and forming a passivation material on at least a back side or edge of the substrate. The passivation material comprises at least one of nitrogen or a metal. The method comprises forming on the workpiece a channel material comprising a metal and a chalcogen, and forming a transistor structure comprising a gate terminal coupled to the channel material.

In thirteenth examples, for any of the twelfth examples forming the channel material comprises heating the workpiece to at least 500° C., and growing the channel material from one or more precursor gases comprising at least one of S or Se.

In fourteenth examples, for any of the thirteenth examples the precursor gases further comprises at least one of W or Mo.

In fifteenth examples, for any of the twelfth through fifteenth examples forming the passivation material further comprises depositing a nitrogen compound from a precursor gas comprising silicon.

In sixteenth examples, for any of the twelfth through fifteenth examples forming the passivation material further comprises depositing an oxygen or nitrogen compound from one or more precursor gases comprises at least one of Al, Hf, or Zr.

In seventeenth examples, for any of the twelfth through sixteenth examples forming the passivation material further comprises forming the passivation material over a front side of the substrate.

In eighteenth examples, for any of the seventeenth examples the channel material is formed over a portion of the passivation material.

In nineteenth examples, for any of the eighteenth examples the channel material is formed within an area over the substrate that is surrounded by the passivation material.

In twentieth examples, for any of the twelfth through seventeenth examples the method further comprises removing the passivation material from at least a portion of the substrate.

However, the above embodiments are not limited in this regard, and, in various implementations, the above embodiments may include the undertaking of only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. An apparatus comprising:

a monocrystalline material comprising a group IV element;

a transistor structure comprising a gate terminal coupled to a channel material, the channel material comprising a metal and a chalcogen; and a passivation material between the monocrystalline material and the transistor structure, wherein the passivation material comprises predominantly silicon and nitrogen.

2. The apparatus of claim 1, wherein the passivation material extends a lateral distance beyond an area of the transistor structure.

3. An apparatus comprising:

a monocrystalline material comprising a group IV element;

a transistor structure comprising a gate terminal coupled to a channel material, the channel material comprising a metal and a chalcogen, wherein the transistor structure is one of a plurality of transistor structures occupying a region over the monocrystalline material; and a passivation material between the monocrystalline material and the transistor structure, wherein the passivation material comprises at least one of nitrogen or a metal, wherein the passivation material is a continuous layer that spans at least an entirety of the region and is at least 50 nm thick.

4. The apparatus of claim 3, wherein:

the monocrystalline material is primarily silicon;

the monocrystalline material and the passivation material are both substantially planar layers within the region of the plurality of transistors; and a plane of the passivation material is parallel to a plane of the monocrystalline material.

5. The apparatus of claim 4, wherein the passivation material is in direct contact with the monocrystalline material.

6. The apparatus of claim 3, wherein the passivation material is amorphous and comprises at least one of Al, Hf or Zr and at least one of oxygen or nitrogen.

7. The apparatus of claim 3, wherein the passivation material comprises predominantly silicon and nitrogen.

8. An integrated circuit (IC) wafer, comprising:

a monocrystalline substrate material comprising a group IV element;

a plurality of IC die regions arrayed over a front side area of the monocrystalline substrate material, wherein individual ones of the IC die regions comprise a transistor structure comprising a gate terminal coupled to a channel material, the channel material comprising a metal and a chalcogen; and a passivation material over a back side area of the monocrystalline substrate material, wherein the passivation material comprises at least one of nitrogen or a metal.

9. The IC wafer of claim 8, wherein the passivation material is adjacent to a sidewall edge of the monocrystalline substrate material.

10. The IC wafer of claim 9, wherein the passivation material is over a portion of the front side of the monocrystalline substrate material within a perimeter bevel area of the wafer adjacent to one or more edges of the IC die regions.

11. The IC wafer of claim 8, wherein the passivation material is between the transistor structure and the front side of the monocrystalline material.

12. A method of fabricating an IC structure, the method comprising:

receiving a workpiece comprising a crystalline Group IV substrate;

forming a passivation material on at least a back side or edge of the substrate, wherein the passivation material is an amorphous compound of at least one of nitrogen or a metal;

forming on the workpiece a channel material comprising a metal and a chalcogen; and forming a transistor structure comprising a gate terminal coupled to the channel material.

13. The method of claim 12, wherein forming the channel material comprises:

heating the workpiece to at least 500° C.; and growing the channel material from one or more precursor gases comprising at least one of S or Se.

14. The method of claim 13, wherein the precursor gases further comprise at least one of W or Mo.

15. The method of claim 12, wherein forming the passivation material further comprises depositing a nitrogen compound from a precursor gas comprising silicon.

16. The method of claim 12, wherein forming the passivation material further comprises depositing an oxygen or nitrogen compound from one or more precursor gases comprising at least one of Al, Hf, or Zr.

17. The method of claim 12, wherein forming the passivation material further comprises forming the passivation material over a front side of the substrate.

18. The method of claim 17, wherein the channel material is formed over a portion of the passivation material.

19. The method of claim 18, wherein the channel material is formed within an area over the substrate that is surrounded by the passivation material.

20. The method of claim 12, further comprising removing the passivation material from at least a portion of the substrate.

* * * * *